United States Patent [19]

Jin et al.

[11] Patent Number: 5,081,075
[45] Date of Patent: Jan. 14, 1992

[54] METHOD OF PRODUCING A SUPERCONDUCTIVE BODY, AND APPARATUS AND SYSTEMS COMPRISING THE BODY

[75] Inventors: Sungho Jin, Millington; Richard C. Sherwood, New Providence; Thomas H. Tiefel, Piscataway, all of N.J.

[73] Assignee: AT&T Laboratories, Murray Hill, N.J.

[21] Appl. No.: 49,767

[22] Filed: May 12, 1987

[51] Int. Cl.$^5$ ............................................. H01L 39/24
[52] U.S. Cl. ........................................ 505/1; 29/599; 148/11.5 F; 252/521; 428/650
[58] Field of Search ........... 29/599; 174/126 S, 128 S; 428/558, 650; 148/11.5 F

[56] References Cited

U.S. PATENT DOCUMENTS 3,796,553  3/1974  Daunt ............................. 428/650 X
4,687,883  8/1987  Flükiger et al. ............ 148/11.5 F X

FOREIGN PATENT DOCUMENTS 52-69295   6/1977  Japan ..................................... 29/599
55-40967  10/1980  Japan ............................. 148/11.5 F

OTHER PUBLICATIONS

Applied Physics Letters, vol. 51, No. 3, Jul. 20, 1987, pp. 203–204 by S. Jin et al.
Proceedings Materials Research Soc. Meeting, Apr. 21–24, 1987, Anaheim, Calif., Fabrication of 91K Superconductor Coils by S. Jin et al.
Proceedings of Intr. Conf. on Low Temperature Physics, Kyoto, 1987, Japan J. Appl. Physics, vol. 26 (1987), Supp. 26–3.
Nature, vol. 327, Jun. 4, 1987, pp. 356–357, Japanese Poised to Dominate in Superconductors as Well?
Fabrication of Dense $Ba_2YCu_3O_{7-\delta}$ Superconductor Wire by Molten Oxide by S. Jin et al.
Stress-and-Field-Dependence of Critical Current in $Ba_2YCu_3O_{7-\delta}$ Superconductors by S. Jin et al.
"Superconductor Applications: SQUIDS and Machines", Francis Bitter National Magnet Laboratory, MIT, Cambridge, Mass., Plenum Press, N.Y. and London, Brian B. Schwartz, et al.
"Superconductor Materials Science-Metallurgy, Fabrication, and Applications", Francis Bitter National Magnet Laboratory, MIT, Cambridge, Mass., Plenum Press, N.Y. and London, Simon Foner, et al.
"Possible High $T_c$ Superconductivity in the Ba–Lu–Cu–O System", Z. Phys. B,-Condensed Matter, 64, 189–193 (1986), J. G. Bednorz and K. A. Muller.
"High-Pressure Study of the New Y–Ba–Cu–O Superconducting Compound System", Phys. Rev. Letters, vol. 58, No. 9, Mar. 1987, P. H. Hor, et al.
"Superconductivity at 93 K in a New Mixed-Phase Y–Ba–Cu–O Compound System at Ambient Pressure", Phys. Rev. Letters, vol. 58, No. 9, Mar. 1987, P. H. Hor, et al.
"Bulk Superconductivity at 91 K in Single-Phase Oxygen-Deficient Perovskite $Ba_2YCu_3O_{9-\delta}$", Phys. Rev. Letters, vol. 58, No. 16, Apr. 1987, R. J. Cava, et al.
"New Superconducting Cuprate Perovskites", Phys. Rev. Letters, vol. 58, No. 18, May 1987, D. W. Murphy, et al.
B. A. Glowacki and J. E. Evetts, "External and Internal Diffusion of Oxygen in Superconducting $YBa_2Cu_3O_7$ Composite Conductors," Materials Research Society Symposium Proceedings, vol. 99, Nov. 30–Dec. 4, 1987, p. 741.

Primary Examiner—Carl J. Arbes
Attorney, Agent, or Firm—Eugene E. Pacher

[57] ABSTRACT

Disclosed are normal metal-clad superconductive bodies (e.g., wires, ribbons) having a normal metal cladding that is porous during at least a part of the manufacture of the body. The porous cladding permits access of an ambient atmosphere to the superconductive material. Exemplarily, the superconductive material is an oxide such as a (Ba, Y) cuprate, the normal metal cladding comprises Ag particles (or Ag-coated particles), and the body is treated in an oxygen-containing atmosphere. Techniques for producing such a body are also disclosed.

15 Claims, 1 Drawing Sheet

METHOD OF PRODUCING A SUPERCONDUCTIVE BODY, AND APPARATUS AND SYSTEMS COMPRISING THE BODY

FIELD OF THE INVENTION

This invention pertains to methods for producing superconductive bodies.

BACKGROUND OF THE INVENTION

From the discovery of superconductivity in 1911 to the recent past, essentially all known superconducting materials were elemental metals (e.g., Hg, the first known superconductor) or metal alloys or intermetallic compounds (e.g., $Nb_3Ge$, probably the material with the highest transition temperature $T_c$ known prior to 1986).

Recently, superconductivity was discovered in a new class of materials, namely, metal oxides. See, for instance, J. G. Bednorz and K. A. Muller, *Zeitschr. f. Physik B—Condensed Matter*, Vol. 64, 189 (1986), which reports superconductivity in lanthanum barium copper oxide.

The above report stimulated worldwide research activity, which very quickly resulted in further significant progress. The progress has resulted, inter alia, to date in the discovery that compositions in the Y-Ba-Cu-O system can have superconductive transition temperatures $T_c$ above 77K., the boiling temperature of liquid $N_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of composition and processing techniques that result in the formation of bulk samples of material that can be substantially single phase material and can have $T_c$ above 90K. (see, for instance, R. J. Cava et al, *Physical Review Letters*, Vol. 58(16), pp. 1676-1679), incorporated herein by reference., Vol. 58(16), pp. 1676-1679).

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be one of the most advantageous cryogenic refrigerant, and attainment of superconductivity at liquid nitrogen temperature was a long-sought goal which until very recently appeared almost unreachable.

Although this goal has now been attained, there still exist barriers that have to be overcome before the new oxidic high $T_c$ superconductive materials can be utilized in many technological applications. In particular, techniques for forming high $T_c$ superconductive bodies of technologically significant shape have to be developed. Among the shapes of technological significance are normal metal-clad elongate bodies, e.g., wires and ribbons.

Prior art metallic superconductors have been prepared in wire and ribbon form, and have found use in, for instance, superconductive magnets. As is well known, superconductive wires and the like are almost invariably surrounded by a normal metal cladding, which provides, inter alia, an alternate current path in the event of a local loss of superconductivity, For a general overview of some potential applications of superconductors see, for instance, B. B. Schwartz and S. Foner, editors, *Superconductor Applications: SQUIDS and MACHINES*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets for e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

U.S. patent application Ser. No. 036,160, a continuation-in-part of U.S. patent application Ser. No. 034,117 ('117), now abandoned titled "Apparatus and Systems Comprising a Clad Superconductive Oxide Body, and Method for Producing Such Body," by S. Jin et al, and incorporated herein by reference, discloses a technique for producing normal-metal clad superconductive oxide wire and other elongate bodies. The technique comprises heat treating the clad elongate body. The oxides of concern herein lose oxygen at relatively high temperatures (such as are typically required for sintering), and can take up oxygen at intermediate temperatures, and the above patent application discloses various techniques for carrying out the heat treatment such that the oxygen content of the sintered oxide is in the range that is associated with superconductivity, and such that the oxide has the appropriate crystal structure. Among the suggested techniques is perforating, at appropriate intervals, the normal metal jacket that surrounds the oxide powder, such that the ambient oxygen can come into contact with the powder. See '117, page 8.

Even though '117 discloses several techniques that can produce elongate clad superconductive oxide bodies such as wires and ribbons, further simple techniques for producing such bodies that reliably permit relatively free access of oxygen to the superconductive oxide during heat treatment may still be of considerable technological and economic significance. This application discloses such a further technique.

DEFINITIONS

The (Ba, Y) cuprate system herein is the class of oxides of nominal general formula $Ba_{2-x}M_{1-y}X_{x+y}Cu_3O_{9-\delta}$, where M is one of Y, Eu, or La, and X is one or more optional element different from Ba and M and selected from the elements of atomic number 57-71, Sc, Ca, and Sr. Typically $x+y$ is in the range 0-1 (with Ba and M being at least 50% unsubstituted), and typically $1.5 < \delta < 2.5$. In a particular preferred subclass of the (Ba, Y) cuprate system $0 \leq y \, 0.1$, with the optional X being one or more of Ca, Sr, Lu and Sc. For further examples see D. W. Murphy et al, *Physical Review Letters*, Vol. 58(18), pp. 1888-1890 (1987).

The (La, Ba) cuprate system herein is the class of oxides of nominal general formula $La_{2-x}M_xCuO_{4-\epsilon}$, where M is one or more divalent metals (e.g., Ba, Sr, Ca), and $x \geq 0.05$, and $0 \leq \epsilon \leq 0.5$.

A "normal" metal herein is a metal that does not become superconductive at temperatures of technological interest, typically at temperatures of 2K. and above.

THE INVENTION

Disclosed is a method of producing a normal-metal-clad superconductive body in which the superconductive material is a chemical compound, typically an oxide. The method permits relatively free access of an ambient atmosphere to the superconductive material during heat treatment of the body, such that the chemical composition (for instance, the oxygen content of a superconductive oxide) can be maintained, or can be caused to be, within predetermined limits that are associated with the occurrence of superconductivity in the chemical compound.

The method comprises forming an intermediate body that comprises a normal metal cladding material surrounding a quantity of the superconductive chemical compound, forming the body from the intermediate body by means of one or more cross-section-reducing operations (e.g., drawing through dies, rolling) or other shape-changing operation, and heat treating the body. The heat treatment conditions are, inter alia, chosen such that typically substantial sintering of the superconductive material occurs. The normal metal cladding material is selected such that at least during a part of the heat treatment the cladding material surrounding the superconductive material is relatively porous, thereby providing relatively free access of an appropriate ambient atmosphere to the superconductive material.

Although the inventive method is preferably used with high $T_c$ oxides such as (Ba, Y) cuprates and (La, Ba) cuprates, it may also have application in connection with other high $T_c$ superconductive chemical compounds (e.g., nitrides, sulfides, hydrides, carbides, fluorides, and chlorides), should such other compounds exist. However, for ease of exposition's sake we will herein frequently refer to "oxides", without intending thereby to imply a limitation of the invention.

Figure 1:
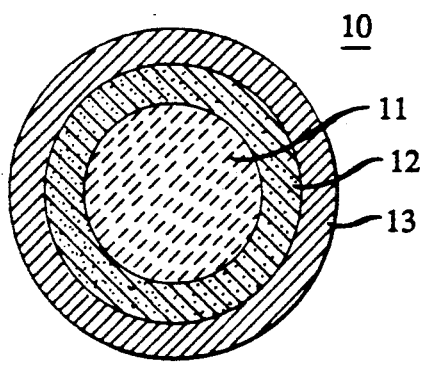
FIGS. 1 and 2 schematically depict in cross sectional view respectively an exemplary intermediate body according to the invention and the clad superconductive body produced therefrom.

An exemplary intermediate body (a "preform") 10 according to the invention is schematically shown in cross sectional view in FIG. 1, wherein 11 is the superconductive material, 12 is the normal metal cladding material, and 13 is a (removable) jacket. The superconductive material typically is in powder form, e.g., (Ba, Y) cuprate powder of nominal composition $Ba_2YCu_3O_7$, or a mixture of superconductive powder and metal powder such as is disclosed in U.S. patent application Ser. No. 046,825 titled "Superconductive Oxide Body Having Improved Properties", filed May 5, 1987 for S. Jin et al. Typically the superconductive material is between about 5 and about 70% by volume of the intermediate body.

The normal metal cladding material typically also consists substantially of powder or other particulates (e.g., flakes), although this is not a requirement. For instance, the normal metal cladding can consist of a tubular body consisting of two (or possibly more) interspersed components (e.g., Al and Ag particles) selected such that one component can be removed (e.g., by etching) after completion of the shape-changing processing but before the heat treatment, substantially without removal of the other.

The normal metal advantageously is chosen from those metals or alloys that are relatively inert with regard to oxidization, and that are relatively benign with respect to the superconductive material. The former is intended to include those metals that undergo self-limiting surface oxidation (although these metals are not preferred), and by the latter we mean that the presence of the normal metal during the heat treatment does not result in significant degradation of the superconductive properties of the superconductive material. Exemplary normal metals are Au, Ag, Pt, and Pd (with Ag being currently preferred). The normal metal cladding material may also comprise compound particles, i.e., particles having a first metal core (e.g., Ni or stainless steel) surrounded by a second metal coating (e.g., Ag). Typically the normal metal cladding material is between about 5 and about 50% by volume of the intermediate body.

The optional removable jacket is present in currently preferred embodiments. However, the jacket could be dispensed with if the normal metal cladding material has sufficient structural integrity to undergo the necessary cross section-reducing or other shaping operations without disruption of the structure. This could, for instance, be the case if the normal metal cladding material is a two-component tubular body as described above. The jacket advantageously consists of relatively ductile material that is removable after completion of the cross section-reducing step and/or other shaping step (e.g., changing the cross section shape, or coil winding). Exemplarily, the jacket comprises Al, Mg, Sn, Zn, or alloys of these metals, polymers such as a softened thermoplastic or a partially cured thermo-setting polymer, or is a composite made from a mixture of metal, polymer, and/or ceramic powders. Typical removal methods are etching (e.g., of an Al jacket), pyrolysis (e.g., of a polymer jacket), melting (e.g., of a Sn jacket) or mechanical removal such as cutting, tearing, or breaking (e.g., of a polymer or composite jacket). The jacket, if present, typically is between about 5 and about 30% by volume of the intermediate body.

In an exemplary and preferred embodiment of the invention the intermediate body comprises an outer jacket (e.g., an Al tube), a tubular porous normal metal body (e.g., compacted or lightly sintered Ag powder) surrounded by the outer jacket, and superconductive oxide powder substantially filling the bore of the tubular porous body. Such an intermediate body can be produced, for instance, by inserting a dummy core rod axially into an Al tube and maintaining the core rod concentrically within the tube. The annular space between the tube and the core rod is then filled with Ag powder, the powder packed, and optionally the assembly is heated such that the Ag powder is lightly sintered. Thereafter the core rod is removed and the space filled with oxide powder.

Many alternative techniques for producing the intermediate body exist. For instance, a binder or grease-type polymer can be mixed with the normal metal powder. These additives serve to reduce cold welding during the cross section reducing operation (e.g., wire drawing). Such cold welding could lead to blockage of a substantial fraction of the pores, thereby reducing the access of gas to the superconductive material. Also, the porous cladding can comprise more than one normal metal, either interspersed or segregated into separate regions of the cladding.

The intermediate body is drawn down, rolled, or otherwise changed in cross section in known fashion, until the desired cross section is attained. As will be appreciated by those skilled in the art, attention has to be paid to the mechanical properties of the various materials that make up the intermediate body, to insure satisfactory behavior during the mechanical processing.

The mechanical processing of an intermediate body comprising both a superconductive powder core and a normal metal powder cladding typically requires particle sliding in both core and cladding. If the two powders have substantially different coefficients of friction, it may be advantageous to appropriately adjust the relative coefficient of friction. This is typically done by addition of an appropriate lubricant to one or both of the powders. Exemplary lubricants are graphite powder, grease, or other organic materials. As discussed above, the addition of lubricant can also be used to control the degree of cold welding during cross section reduction. Whereas some cold welding of the jacket material is desirable to increase its cohesion, extensive cold welding can undesirably reduce the porosity of the jacket.

Figure 2:
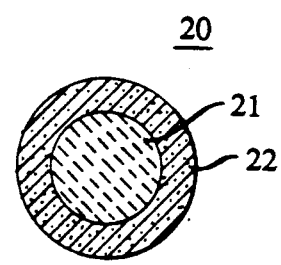

After completion of the cross-section reduction the elongate body typically is formed into some desired shape, e.g., into a coil, and the outer jacket material removed by some appropriate process (e.g., etching). FIG. 2 shows schematically, in cross section, an exemplary elongate body, with 21 being the superconductive material, and 22 being the porous normal metal jacket. The resulting article is then heat treated to sinter the superconductive oxide powder and to adjust the oxygen content of the oxide and to produce the desired crystal phase, substantially in the conventional manner. See, for instance, R. J. Cava, op. cit. Exemplarily, the article is heated in an oxygen-containing atmosphere (air, flowing $O_2$, high pressure $O_2$) to a temperature in the range 500°–1000° C., maintained at that temperature for a time in the range 1–100 hours in contact with the atmosphere, cooled relatively slowly (typically at an average rate less than about 250° C./hour, and not excluding stops at intermediate temperatures) and in contact with the atmosphere to a temperature in the range 200°–500° C., followed by cooling to room temperature.

The thus produced normal metal clad elongate superconductor can, if desired, be coated with any appropriate material, e.g., a polymer, or a normal metal, e.g., by spraying with, or dipping into, an appropriate liquid or melt, or by vapor phase deposition. Such coating preferably is not porous, and advantageously is chosen such as to be substantially impermeable to $O_2$, water vapor, and other gases. Alternatively, the surface of the porous normal metal cladding can selectively be melted (e.g., by means of a laser) and resolidified so as to seal the outside of the porous cladding while maintaining the superconductive properties of the superconductive core.

Superconductive bodies according to the invention can be used in a variety of apparatus and systems. An exemplary apparatus, a superconductive solenoid 30, is shown schematically in FIG. 3, with 31 being a clad superconductive body according to the invention, and 32 being a tubular support body.

As was indicated above, the inventive method can not only be used to produce normal metal-clad superconductive oxide bodies but is in principle applicable to producing normal metal-clad bodies from any material that requires to be in contact with an atmosphere (e.g., $O_2$, $CO_2$, $N_2$, $Cl_2$, $F_2$) during heat treatment.

EXAMPLE I

Into an Al tube (0.25 inches outside diameter, 0.030 inches wall thickness) with sealed bottom was inserted a 0.125 inch diameter stainless steel rod and held centered. The space between tube and rod was packed with Ag powder of average particle size 8 $\mu$m. The rod was then removed, and oxide powder of nominal composition $Ba_2YCu_3O_7$ and average particle size 2.5 $\mu$m, produced substantially as described by Cava et al (op. cit.), was poured into the resulting space and packed. The open end of the thus formed intermediate body (preform) was then sealed by folding in and swaging. The processing to this point was carried out in air. The preform diameter was then reduced to 0.180 inches by drawing through dies in a conventional manner (4 passes). The Al outer jacket was dissolved by placing the drawn body into a sodium hydroxide bath. The remaining elongate body had an outer diameter of about 0.125 inches. The body was maintained 8 hours at 930° C. in flowing $O_2$, furnace cooled to 600° C., maintained at that temperature for 8 hours, then furnace cooled to 300° C., all in flowing $O_2$. The heat treated elongate body was then tested and found to be superconductive at 77K. Its $T_c$ is about 93K.

EXAMPLE II

A tubular body (0.25 and 0.21 inch outer and inner diameter, respectively) is formed from intimately mixed Ag and Al powder (2:1 by volume, average particles sizes 0.003 and 0.020 inches, respectively) by hot pressing (600° C.) in a conventional manner. One end of the tubular body is closed off, and powder (2.5 $\mu$m average size) of nominal composition $Ba_2YCu_3O_7$ is packed into the bore. After closing off the second end, the cross section of the thus formed preform is reduced by rolling to a 0.030 inch thick ribbon, which is placed in a sodium hydroxide bath for a time sufficient for dissolution of the Al component from the normal metal jacket. The thus produced body with a porous jacket is heat treated substantially as described in Example I, and is superconductive at 77K.

EXAMPLE III

Figure 3:
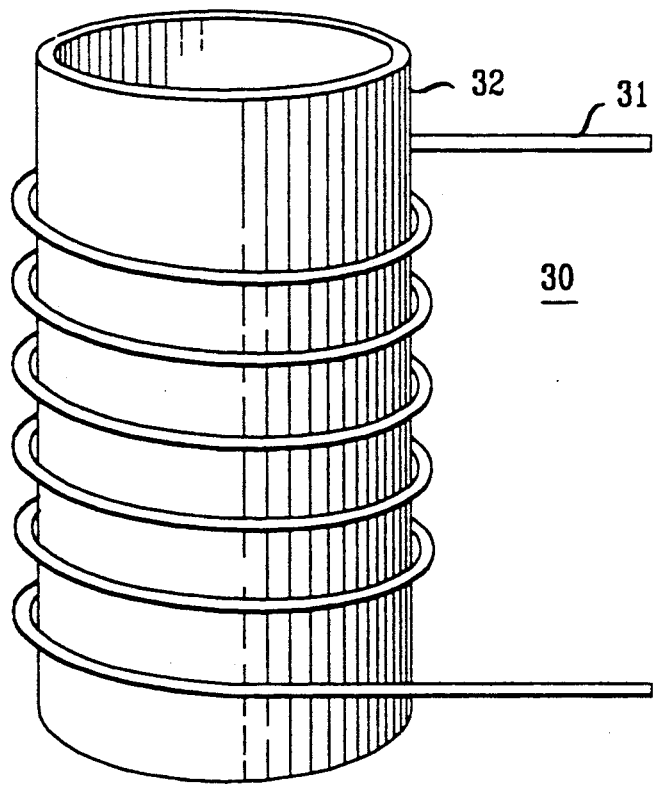
FIG. 3 schematically shows exemplary inventive apparatus, namely, a superconductive solenoid.

A superconductive wire is made substantially as described in Example I, except that, prior to dissolution of the Al jacket, the wire is wound helically around a mandrel. The thus produced coil is placed over a tubular support body, substantially as shown in FIG. 3.

What is claimed is:

1. Method of producing a normal metal-clad superconductive body, the method comprising
   a) forming an intermediate body comprising normal metal cladding material surrounding a quantity of material that comprises superconductive oxide material;
   b) forming the body from the intermediate body by means of one or more shape-changing operations; and
   c) heat treating the body such that substantial sintering of the material occurs, and such that, after completion of the heat treatment, the chemical composition of the oxide material is within predetermined limits that are associated with the occurrence of superconductivity in the oxide material;

Characterized in that at least during a part of c) the normal metal cladding material surrounding the material is a substantially porous material, such that an ambient oxygen-containing atmosphere can come into contact with the oxide material.

2. Method of claim 1, comprising providing a normal metal cladding material that comprises a metal selected from the group consisting of Au, Ag, Pt, and Pd.

3. Method of claim 1, wherein the body is an elongate body, and comprising providing a material that comprises (Ba, Y) cuprate powder or (La, Ba) cuprate powder, and normal metal cladding material that comprises Ag.

4. Method of claim 1, wherein a) comprises
 i) providing a substantially tubular outer jacket and an inner member positioned in the bore of the outer jacket such that a substantially annular space is defined;
 ii) substantially filling the annular space with a normal metal powder; and
 iii) removing the inner member such that a substantially cylindrical space surrounded by porous normal metal results, and substantially filling the cylindrical space with the material comprising superconductive oxide powder; and wherein the outer jacket is removed prior to c).

5. Method of claim 4, comprising providing an outer jacket that consists substantially of Al.

6. Method of claim 1, wherein prior to c) the normal metal cladding material comprises a relatively low porosity material, and comprising transforming the relatively low porosity material into a relatively high porosity material prior to completion of c).

7. Method of claim 6, wherein the relatively low porosity material consists substantially of interspersed particles of at least a first and a second material, and wherein transforming the low porosity material into the relatively high porosity material comprises contacting the body with a selective etching medium adapted for removing the first material at a substantially higher rate than the second material.

8. Method of claim 7, comprising providing a relatively low porosity cladding material in which the first material particles are Al and the second material particles are Ag.

9. Method of claim 1, wherein the material is a multi-component material that comprises, in addition to a superconductive first component, a non-superconductive second component consisting substantially of one or more normal metals that are interspersed with the first component.

10. Method of claim 1, wherein the shape-changing operation comprises a cross section-reducing operation, the body is an elongate body, and the method further comprises forming, prior to completion of c), the elongate body into a predetermined shape.

11. Method of claim 1, comprising providing a normal metal cladding material that comprises compound particles consisting substantially of a first metal core and a second metal coating surrounding the core.

12. Method of claim 3, comprising providing a (Ba, Y) cuprate powder of nominal composition $Ba_2YCu_3O_7$ and a normal cladding material that consists substantially of Ag powder, further comprising forming prior to completion of c), the elongate body into a predetermined shape, and wherein c) comprises maintaining the elongate body at a temperature in the range 500°–1000° C. for a time in the range 1–100 hours, and relatively slowly cooling the elongate body to a temperature in the range 200°–500° C.

13. Method of claim 1, further comprising treating the body, subsequent to c), such that the ambient atmosphere is substantially precluded from contact with the oxide material.

14. Method of claim 13, wherein treating the body comprises applying a coating to the body.

15. Method of claim 13, wherein treating the body comprises melting the outer portion of the normal metal cladding.

* * * * *